(12) United States Patent
Gwin

(10) Patent No.: US 7,882,634 B2
(45) Date of Patent: Feb. 8, 2011

(54) METHOD OF MANUFACTURING HEAT SINK USING CLAD METAL

(75) Inventor: Paul J. Gwin, Orangevale, CA (US)

(73) Assignee: Intel Corporation, Santa Clara, CA (US)

( * ) Notice: Subject to any disclaimer, the term of this patent is extended or adjusted under 35 U.S.C. 154(b) by 239 days.

(21) Appl. No.: 12/182,511

(22) Filed: Jul. 30, 2008

(65) Prior Publication Data

US 2008/0282543 A1 Nov. 20, 2008

Related U.S. Application Data

(62) Division of application No. 11/391,494, filed on Mar. 28, 2006, now Pat. No. 7,446,412.

(51) Int. Cl.
B23P 15/26 (2006.01)
(52) U.S. Cl. .................................. 29/890.054
(58) Field of Classification Search ............ 29/890.054, 29/890.039, 890.041, 840, 832, 836, 890.03, 29/458, 460; 257/722, E23.102, E23.103, 257/E23.107, 720, 719, 712, 713; 165/133, 165/185, 80.3; 228/183; 361/704; 385/14
See application file for complete search history.

(56) References Cited

U.S. PATENT DOCUMENTS

| | | | |
|---|---|---|---|
| 2,938,846 | A | 5/1960 | Hix et al. |
| 3,434,939 | A | 3/1969 | Mickelson et al. |
| 3,527,688 | A | 9/1970 | Giacopelli |
| 6,085,830 | A | 7/2000 | Mashiko et al. |
| 6,085,833 | A | 7/2000 | Kimura et al. |
| 6,749,010 | B2 | 6/2004 | Getz, Jr. et al. |
| 6,758,263 | B2 | 7/2004 | Krassowski et al. |
| 6,907,917 | B2 | 6/2005 | Chu et al. |
| 6,918,438 | B2 | 7/2005 | Ellsworth, Jr. et al. |
| 7,254,888 | B2 | 8/2007 | Chu et al. |
| 7,420,810 | B2 * | 9/2008 | Reis et al. .............. 361/707 |

(Continued)

FOREIGN PATENT DOCUMENTS

JP 05226527 A 9/1993

(Continued)

OTHER PUBLICATIONS

"PCT International Search Report of the International Searching Authority", mailed Sep. 3, 2007, for PCT/US2007/064285, 3pgs.

*Primary Examiner*—John C Hong
(74) *Attorney, Agent, or Firm*—Buckley, Maschoff & Talwalkar LLC

(57) ABSTRACT

According to some embodiments, an outer metal is cladded to a core metal to create a cladded heat sink fin, the cladded heat sink fin is inserted in a groove of a heat sink base, and the outer metal is heated to a reflow temperature of the outer metal. Embodiments may alternatively include a heat sink base, an upper metal cladded to an upper surface of the heat sink base, the upper metal defining at least one groove, and a heat sink fin disposed in the groove and secured to the upper metal. Further to the foregoing, embodiments may include a lower metal cladded to a lower surface of the heat sink base, and a pedestal secured to the lower cladding.

12 Claims, 11 Drawing Sheets

U.S. PATENT DOCUMENTS

| | | |
|---|---|---|
| 2002/0007936 A1 | 1/2002 | Woerner et al. |
| 2005/0167085 A1 | 8/2005 | Chu et al. |
| 2007/0297713 A1 | 12/2007 | Lu et al. |

FOREIGN PATENT DOCUMENTS

| | | |
|---|---|---|
| JP | 06163607 A | 6/1994 |
| JP | 09331003 A | 12/1997 |
| JP | 10284652 A | 10/1998 |

* cited by examiner

METHOD OF MANUFACTURING HEAT SINK USING CLAD METAL

CROSS REFERENCE TO RELATED APPLICATION

This is a divisional of co-pending prior U.S. patent application Ser. No. 11/391,494, filed Mar. 28, 2006.

BACKGROUND

Heat sinks are used to dissipate heat from electrical components, such as integrated circuits (ICs). Conventional heat sinks are manufactured in various configurations. For instance, in the case of a crimped heat sink, grooves are machined in a heat sink base to accept heat sink fins. A heat sink fin is inserted into each groove, and the walls of each groove are impact-deformed (crimped). The deformation causes the walls to push against the inserted heat sink fins and to thereby hold each heat sink fin in its respective groove.

FIGS. 1 and 2 illustrate a top view and a side view, respectively, of prior art crimped heat sink 100. Heat sink 100 includes heat sink base 105 and heat sink fins 110. Heat sink base 105 defines grooves 115 into which heat sink fins 110 are inserted. Walls 120 of grooves 115 are crimped to secure heat sink fins 110 in grooves 115. Crimping creates voids 125, which exhibit high thermal resistance.

Heat sink base 105 is coupled to pedestal 130 via solder layer 135 and nickel layer 140. Pedestal 130 is intended to contact an electrical component that is to be cooled using heat sink 100. Heat sink designs are desired that may provide more efficient heat dissipation, more efficient manufacture, and/or improved physical integrity.

DETAILED DESCRIPTION

Figure 1:
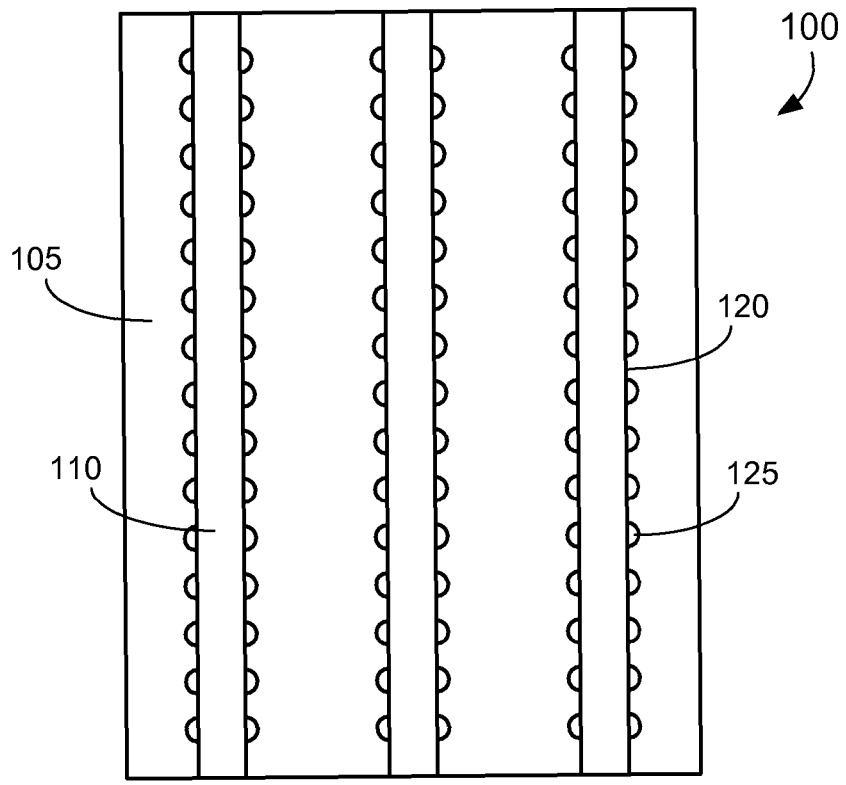
FIG. 1 is a top view of a prior art crimped heat sink.
Figure 2:
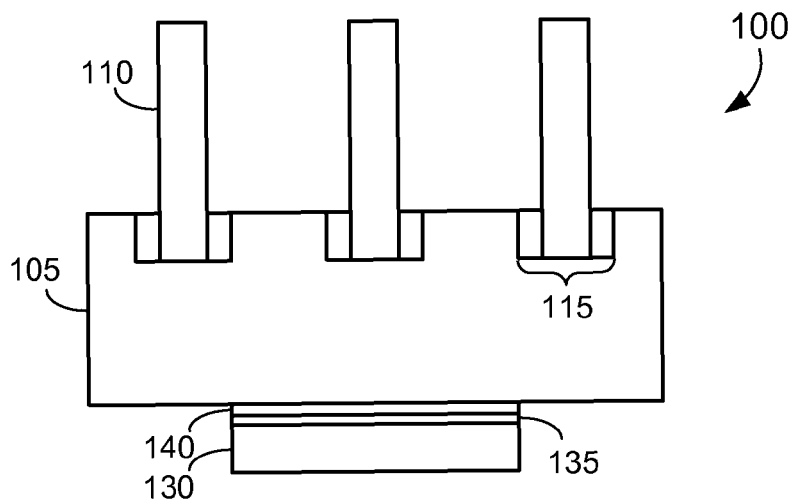
FIG. 2 is a side view of a prior art crimped heat sink.
Figure 3:
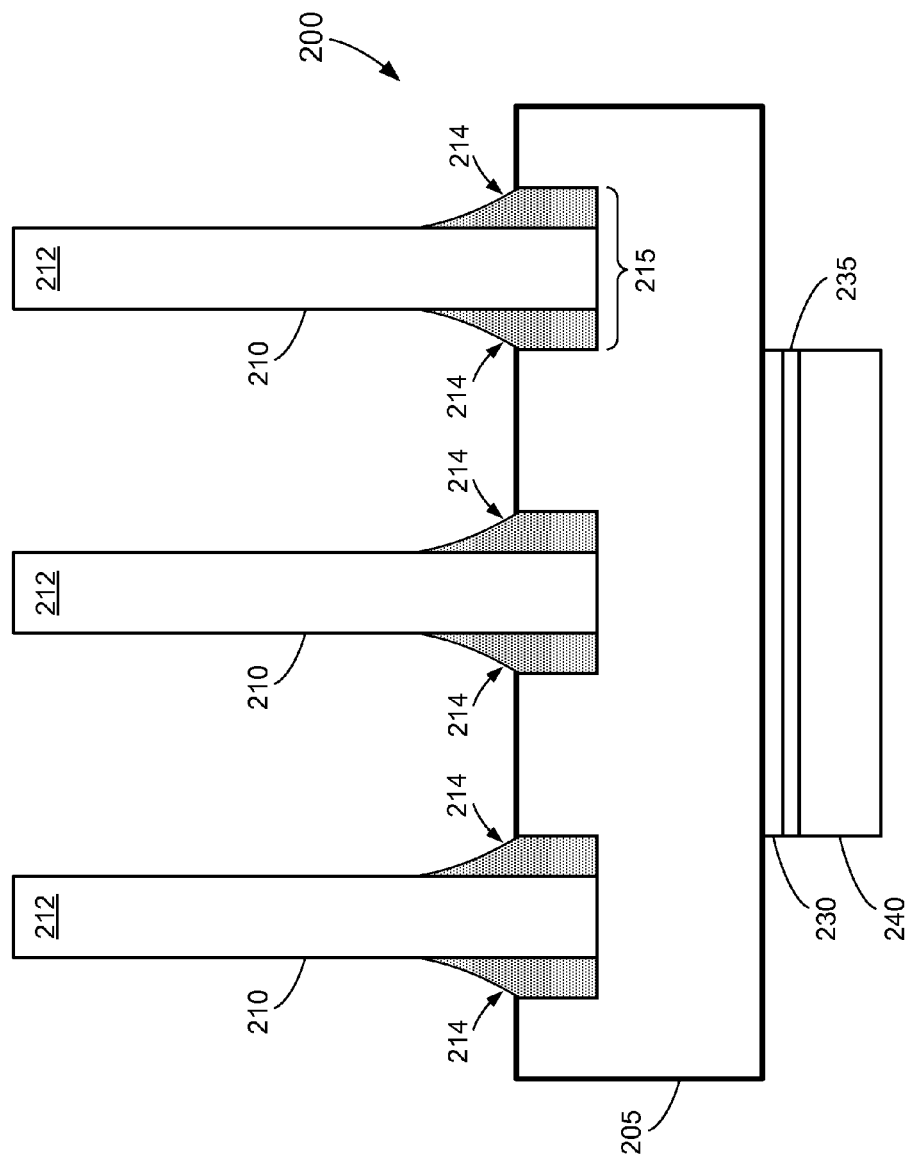
FIG. 3 is a side cutaway view of an apparatus according to some embodiments.

FIG. 3 illustrates a side view of heat sink 200 according to some embodiments. Heat sink 200 includes heat sink base 205 and heat sink fins 210. Heat sink base 205 may comprise an alloy of aluminum. A plurality of grooves 215 is defined in heat sink base 205. In some embodiments, grooves 215 may be milled or cut within heat sink base 205.

Heat sink fins 210 are disposed within grooves 215 of heat sink base 205. Heat sink fins 210 include core metal 212, which may comprise any suitable material. Examples include but are not limited to plate aluminum and/or an alloy of aluminum. FIG. 3 also illustrates flowed outer metal 214 within a respective groove 215. Flowed outer metal may exhibit a lower melting temperature than core metal 212. According to some embodiments, outer metal 214 may comprise pure or low-alloyed aluminum. Outer metal 214 physically and/or thermally couples its corresponding core metal 212 to heat sink base 205. Such an arrangement may provide advantages in performance and/or manufacture of heat sink 200.

Although outer metal 214 is illustrated as fully occupying each groove 215 as well as an area above heat sink base 205, the relative dimensions of reflowed outer metal 214 may differ across embodiments. By providing outer metal 214 within an area above heat sink base 205, heat sink 200 may exhibit increased thermal conductivity between heat sink fin 210 and heat sink base 205 than in the absence of such outer metal 214.

Heat sink base 205 is coupled to nickel layer 230. Nickel layer 230 is coupled to solder layer 235, which is in turn coupled to pedestal 240. Pedestal 240 may comprise copper in some embodiments.

Figure 4:
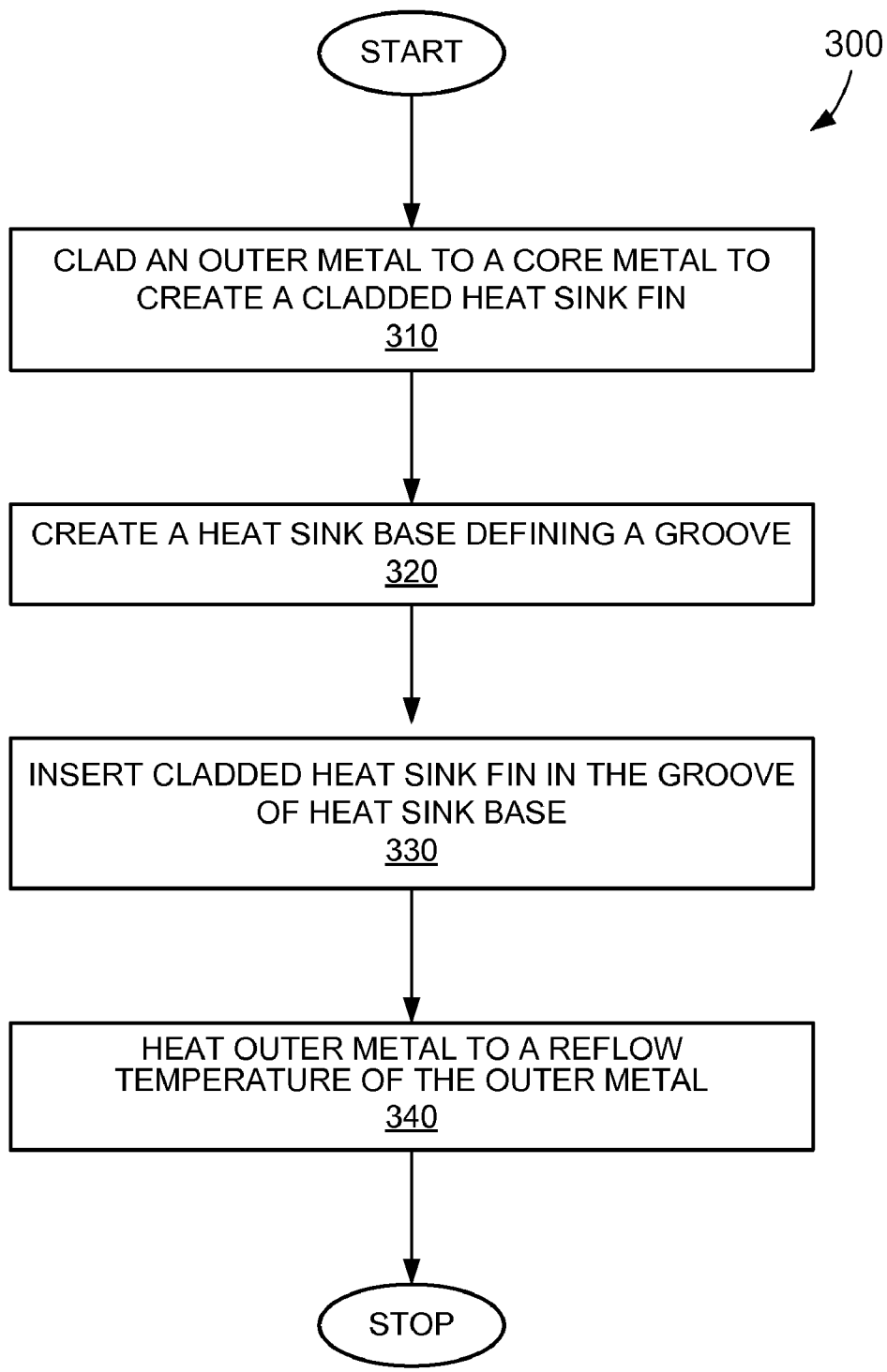
FIG. 4 is a flow diagram of a process to manufacture a heat sink according to some embodiments.

FIG. 4 illustrates process 300 for manufacturing a heat sink according to some embodiments. Process 300 may be performed by any combination of machinery, hardware and/or software, some of which may be remote from one another. Some elements of process 300 may be performed manually.

Initially, at 310, an outer metal is cladded to a core metal to create a cladded heat sink fine. The outer metal may exhibit a lower melting temperature than the core metal. According to some embodiments, the core metal comprises standard alloy aluminum and the outer metal comprises low-alloy aluminum. Any currently- or hereafter-known cladding process may be employed at 310. In some embodiments, the outer metal is pressed ("co-rolled") onto a first side of a core metal at 310.

Figure 5:
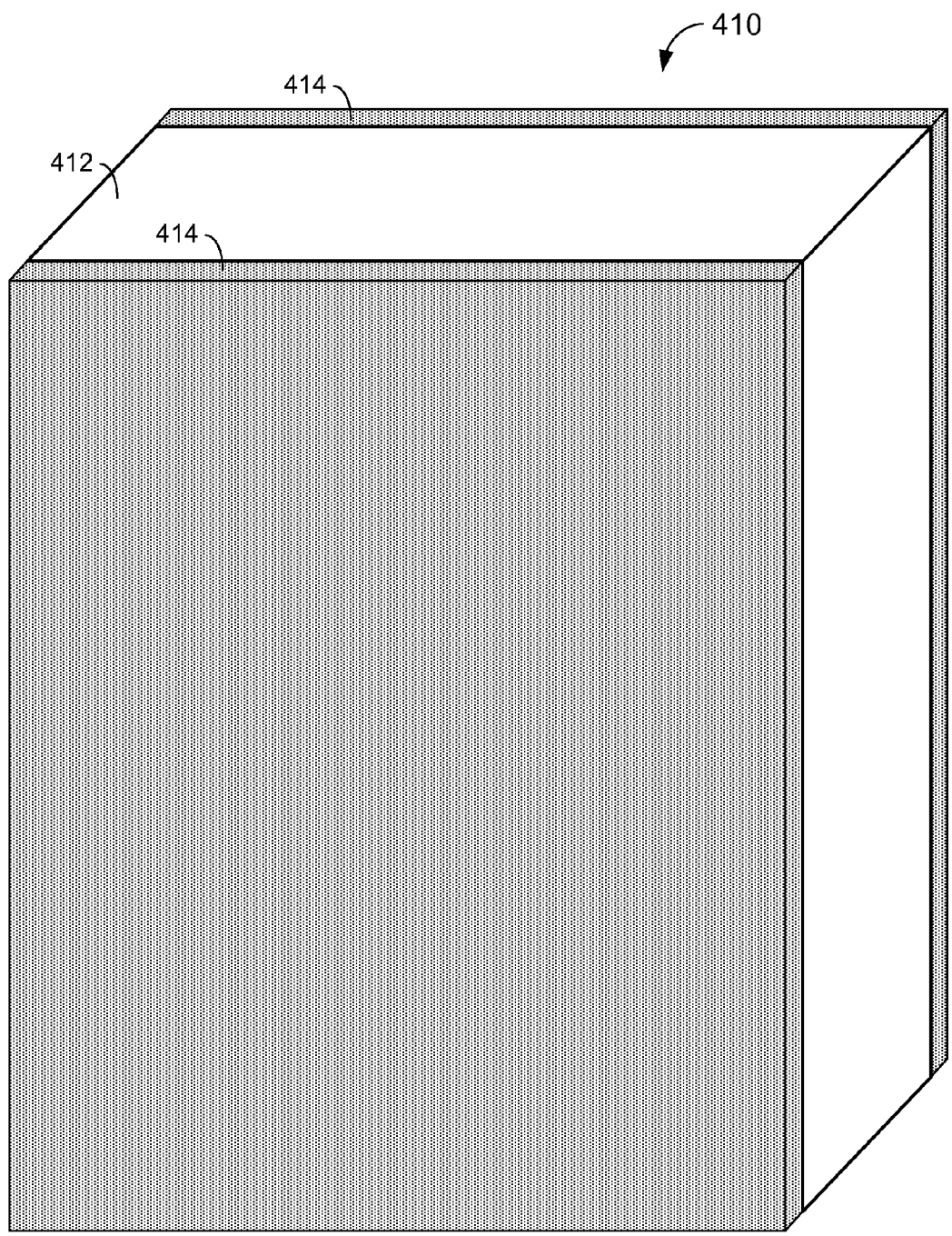
FIG. 5 is a side view of a cladded heat sink fin according to some embodiments.

According to some embodiments, an outer metal is also applied to a second side of the core metal at 310. FIG. 5 illustrates cladded heat sink fin 410 after such embodiments of 310. As shown, outer metal 414 is clad to outer metal 412. In some embodiments, outer metal 414 does not completely cover a surface of core metal 412 as shown in FIG. 5.

Figure 6:
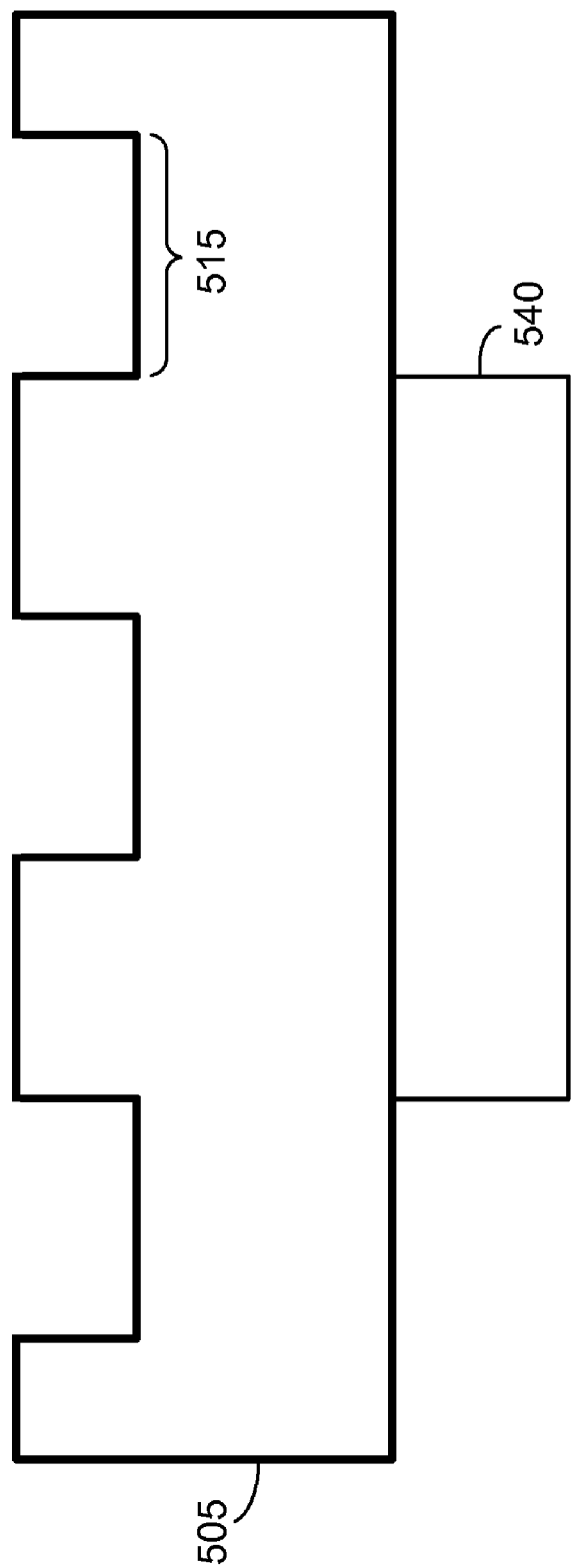
FIG. 6 is a side cutaway view of a heat sink base and a pedestal according to some embodiments.

Next, at 320, a heat sink base defining a groove is created. According to some embodiments, the heat sink base may be created at 320 by milling, stamping, or otherwise generating the grooves. The heat sink base created at 320 may comprise aluminum having a higher melting temperature than the outer metal, and the grooves may be configured to receive the heat sink fin created at 310. FIG. 6 is a cutaway side view of heat sink base 505 created according to some embodiments of 320. Heat sink base 505 defines groove 515 and according to some embodiments is also coupled to pedestal 540.

Figure 7:
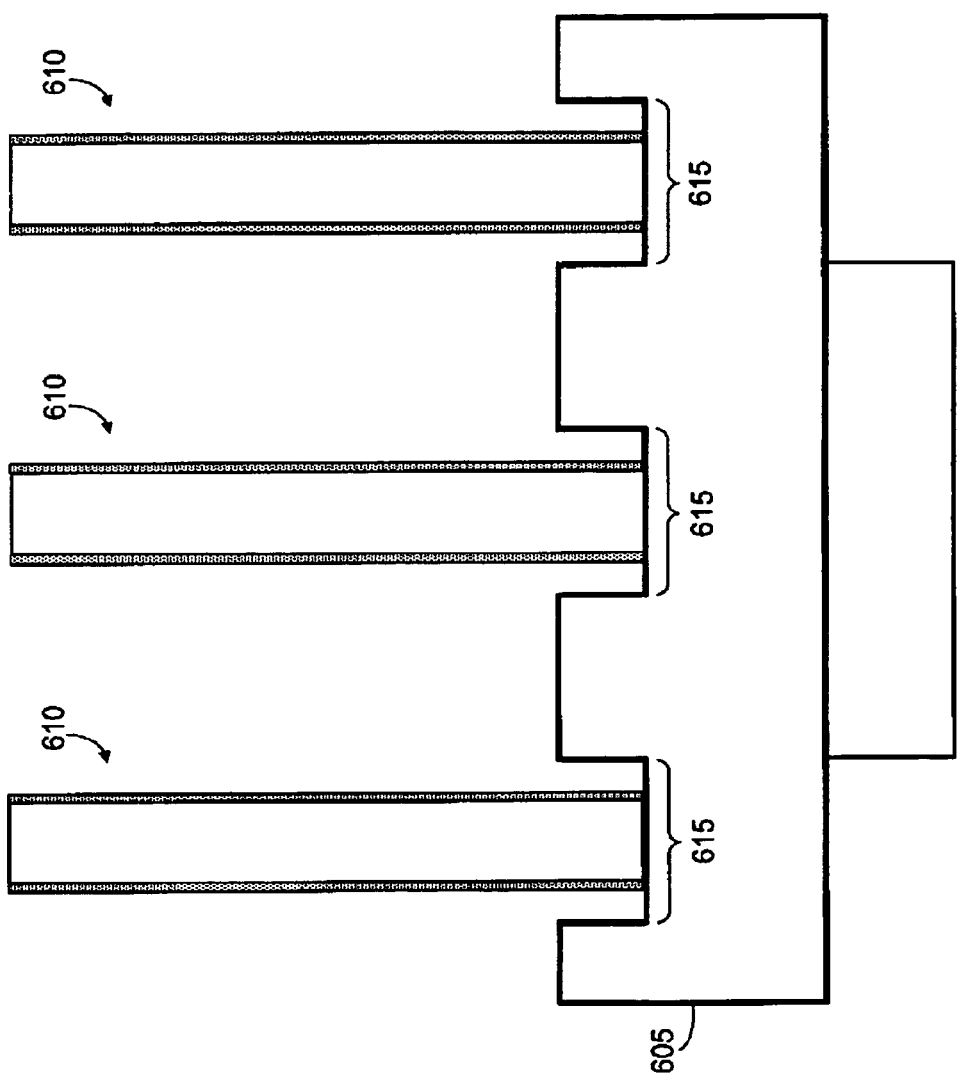
FIG. 7 is a side cutaway view of a heat sink base, a pedestal, and cladded heat sink fins according to some embodiments.

The cladded heat sink fin is inserted into the groove of the heat sink base at 330. FIG. 7 shows cladded heat sink fins 610 after placement in grooves 615 of heat sink base 605. In some embodiments, heat sink fins 610 are inserted into grooves 615 by a placement head of a fabrication machine and may be held thereby during 340.

In this regard, the outer metal is heated to a reflow temperature of the outer metal at 340. The heat sink fin and the heat sink base are placed in a reflow oven to heat the outer metal according to some embodiments of 340. The heated outer metal may flow into the grooves of the heat sink base as shown in FIG. 3. Upon cooling sufficiently, the flowed outer metal may thereby physically and thermally couple the heat sink fin to the heat sink base.

According to some embodiments, flux is applied to the outer metal prior to 340. Flux may also be applied to the grooves of the heat sink base. The flux may by heated to its melting temperature prior to 340 to cause the flux to strip an impurity, such as an oxide, from the outer metal. In this regard, the melting temperature of the flux may be less than the reflow temperature of the outer metal.

In some embodiments, a wall defining the groove is crimped toward the cladded heat sink fin after 330 and prior to 340. This crimping may improve the physical and/or thermal coupling between the heat sink fin and the heat sink base.

Figure 8:
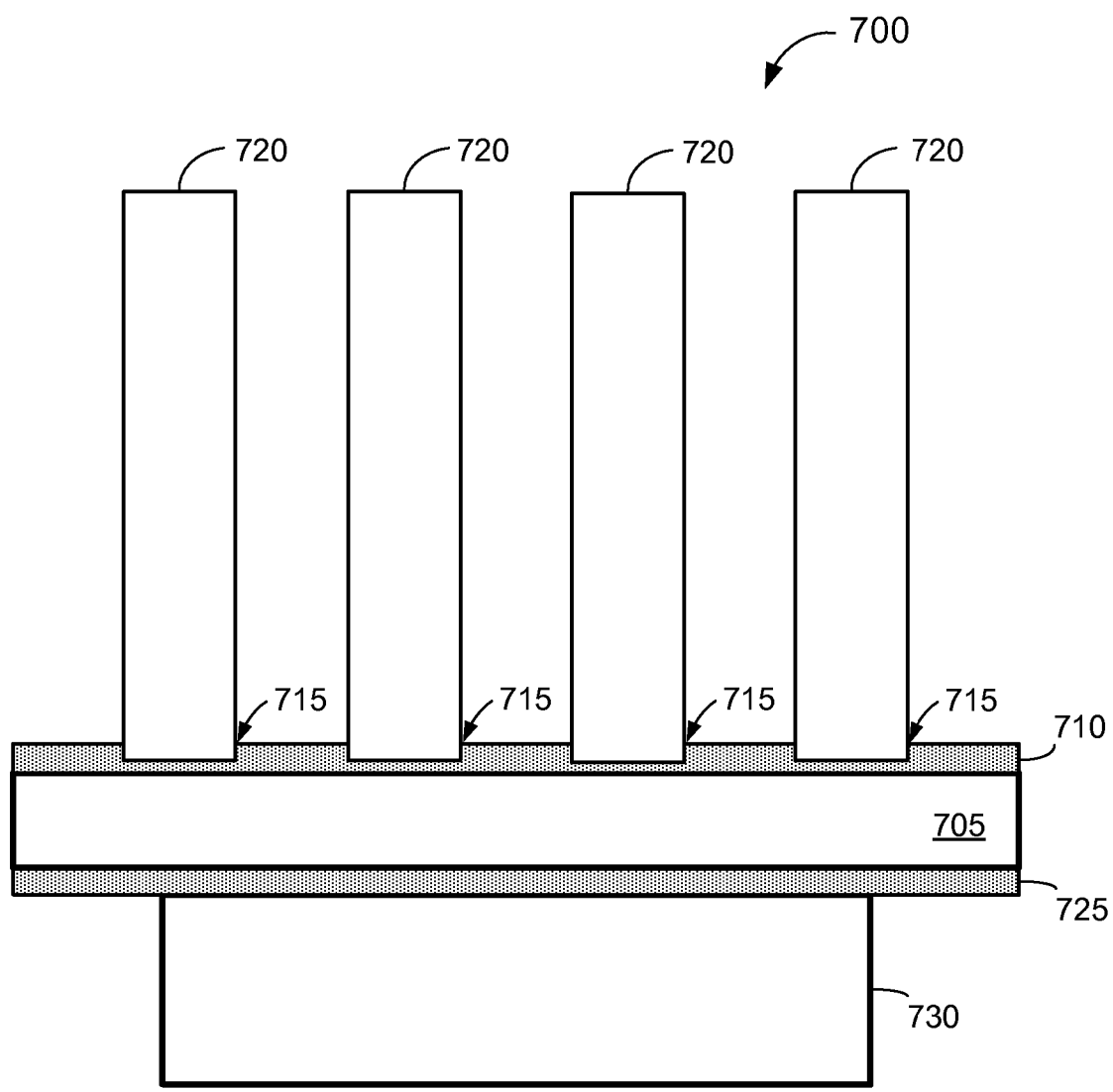
FIG. 8 is a side cutaway view of an apparatus according to some embodiments.

FIG. 8 is a cutaway side view of heat sink 700 according to some embodiments. Heat sink 700 includes heat sink base 705 and upper metal 710. Upper metal 710 is clad to an upper surface of heat sink base 705 and defines grooves 715. Heat sink fins 720 are disposed into respective ones of grooves 715. Lower metal 725 is clad to a lower surface of heat sink base 705 and coupled to pedestal 730.

Heat sink base 705 and heat sink fins 720 may comprise plate aluminum. Upper metal 710 and lower metal 725 may comprise identical or different materials. According to some embodiments, upper metal 710 and lower metal 725 comprise low alloy aluminum that exhibits a reflow temperature lower than a melting temperature of heat sink base 705 and heat sink fins 720.

In some embodiments, heat sink fins 720 are coupled to upper metal 715 by heating upper metal 715 to a reflow temperature of upper metal 715. Pedestal 730 may be secured to lower metal 725 by heating lower metal 725 to a reflow temperature of lower metal 725.

Figure 9:
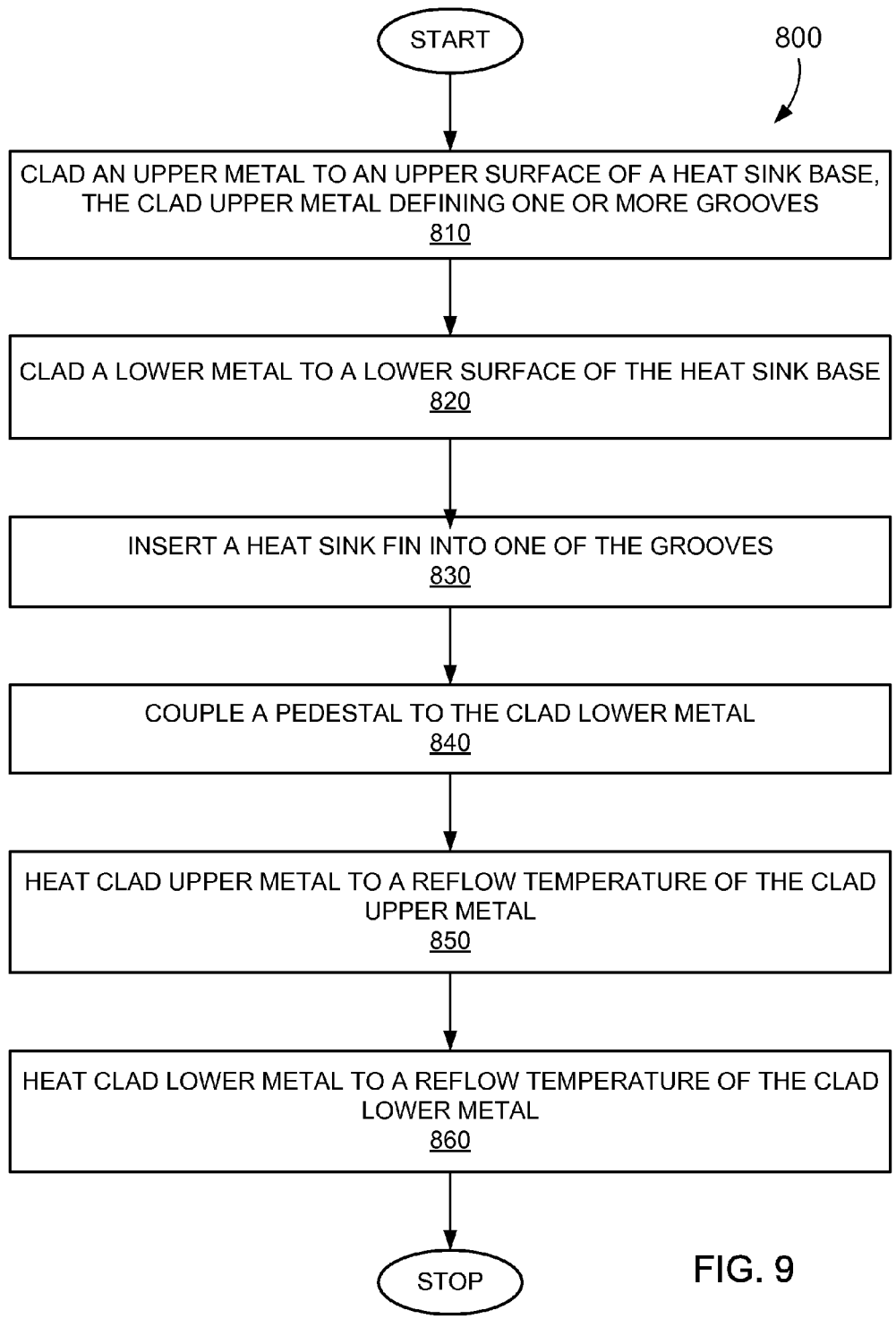
FIG. 9 is a flow diagram of a process to manufacture a heat sink according to some embodiments.

FIG. 9 illustrates process 800 for manufacturing a heat sink such as heat sink 700 according to some embodiments. Process 800 may be performed by any combination of machinery, hardware and/or software, some of which may be remote from one another. Elements of process 800 may also be performed manually.

Initially, at 810, an upper metal is clad to an upper surface of a heat sink base. The clad upper metal defines one or more grooves. The grooves may be created within the upper metal before, during or after the upper metal is clad to the heat sink base. A lower metal is clad to a lower surface of the heat sink base at 820. The lower metal may be clad to the lower surface before, during, or after the upper metal is clad to the upper surface of the heat sink base.

Figure 10:
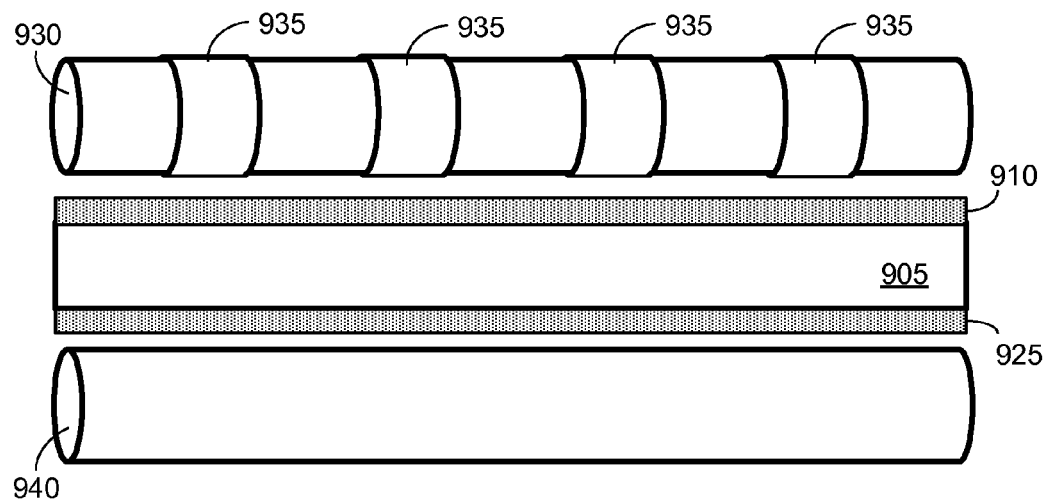
FIG. 10 illustrates cladding an upper metal and a lower metal to a heat sink base according to some embodiments.

FIG. 10 illustrates cladding the lower metal and the upper metal according to some embodiments of 810 and 820. Upper metal 910 is placed against an upper surface of heat sink base 905 and lower metal 925 is placed against a lower surface of heat sink base 905. Rollers 930 and 940 are then pressed into upper metal 910 and lower metal 925, respectively, to clad the metals to heat sink base 905. Upper metal 910 and lower metal 925 may be subjected to heat during this process. As mentioned above, any other systems to clad metals may be used in process 800.

Figure 11:
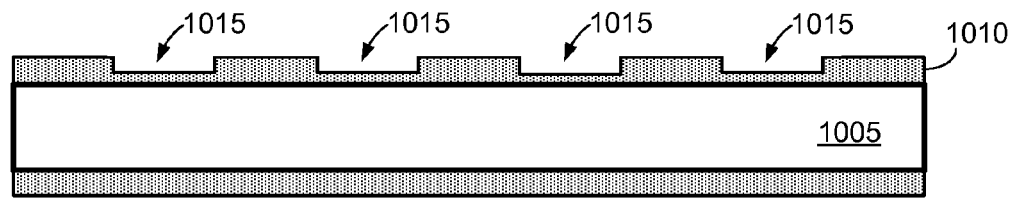
FIG. 11 is a side cutaway view of a heat sink base, an upper metal defining grooves, and a lower metal according to some embodiments.

Roller 930 includes ridges 935 to generate grooves in upper metal 910 during 810. Grooves 1015 of FIG. 11 illustrate grooves that may be generated in such a manner. According to some embodiments, grooves 1015 are milled and/or grinded into upper metal 1010 after upper metal 1010 is clad to base 1005. Sizes and shapes of grooves 1015 may differ among various embodiments.

Figure 12:
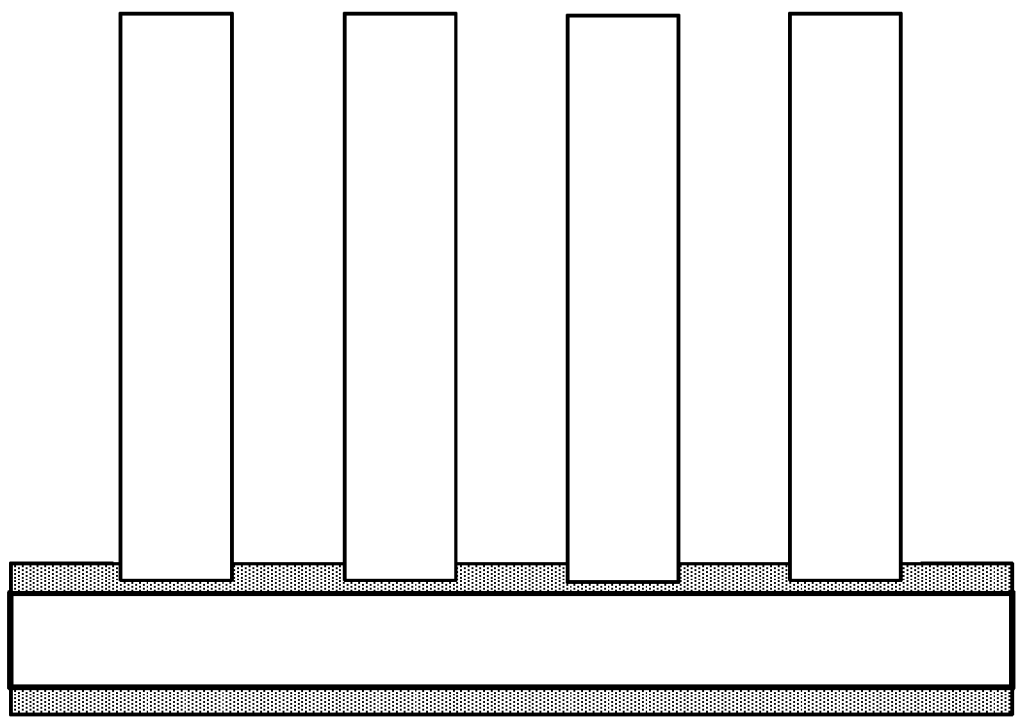
FIG. 12 is a side cutaway view of a heat sink base, an upper metal defining grooves, a lower metal, and heat sink fins according to some embodiments.

A heat sink fin is inserted into a groove at 830. The heat sink fin may comprise a conventional heat sink fin and is illustrated in FIG. 12. The heat sink fin may be held in the groove for the remainder of process 800 by friction between walls of the groove and the fin, by a machine used to place the fin in the groove, or otherwise.

A pedestal may then be coupled to the clad lower metal at 840. A resulting structure according to some embodiments is illustrated in FIG. 8. Again, the pedestal may be held in place during the remainder of process 800.

The clad upper metal is heated to a reflow temperature of the clad upper metal at 850 and the clad lower metal is heated to a reflow temperature of the clad lower metal at 860. 850 and 860 may occur simultaneously, particularly in a case that the upper metal is identical to the lower metal. For example, the heat sink fins, upper metal, heat sink base, lower metal, and pedestal may be heated together in an oven to the appropriate temperature. Any other systems to heat the upper metal and the lower metal to their associated reflow temperatures may be used at 850 and 860.

Heating the grooved upper metal to its reflow temperature causes upper metal to reflow and, upon cooling, to secure the heat sink fins within the grooves and thereby to the heat sink base. Similarly, heating the lower metal to its reflow temperature couples the pedestal to the lower metal and thereby to the heat sink base. Some embodiments of process 800 may reduce a need for a solder layer between a pedestal and a heat sink base. Furthermore, process 800 may reduce a need for a nickel layer to couple a copper pedestal to an aluminum base.

Figure 13:
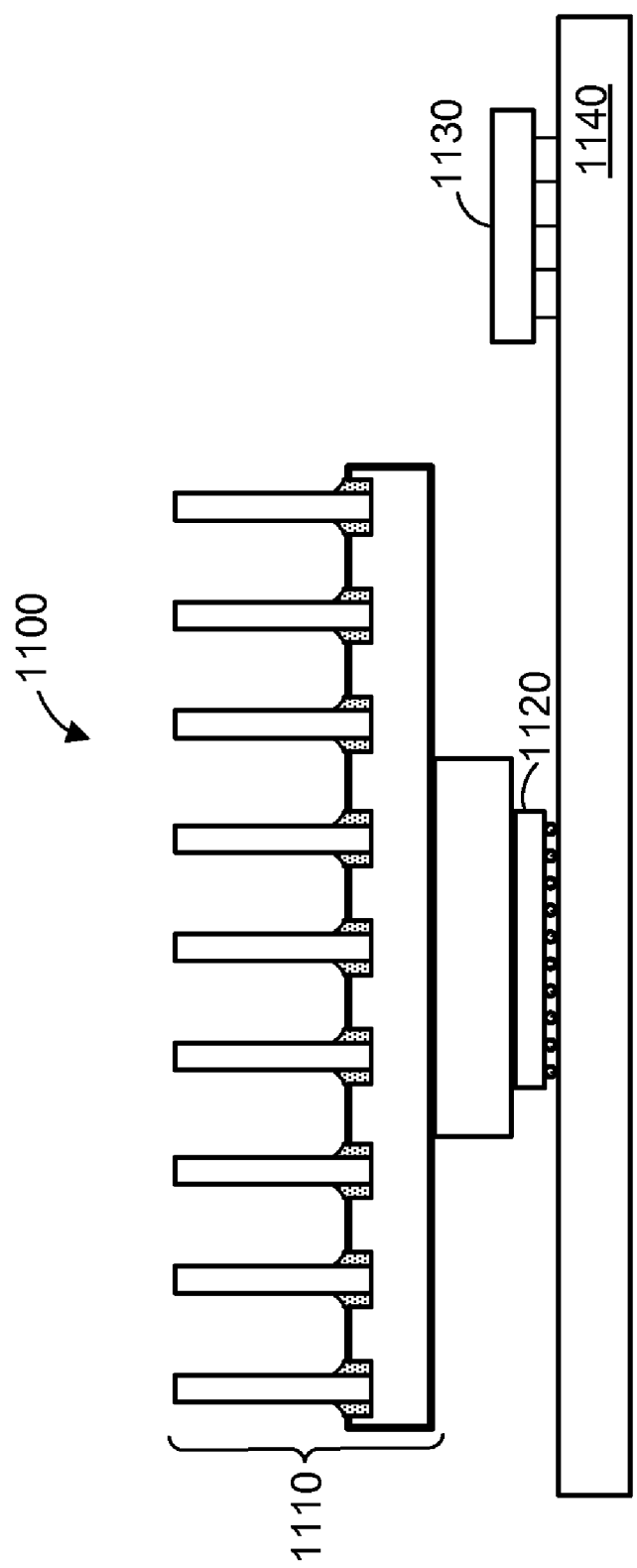
FIG. 13 is a side elevational view of a system according to some embodiments.

FIG. 13 illustrates system 1100 according to some embodiments. System 1100 includes heat sink 1110 according to some embodiments. More specifically, heat sink 1110 may exhibit a construction similar to heat sink 200 and/or heat sink 700 and may be manufactured according to process 300 and/or process 800.

Heat sink 1110 is coupled to IC die 1120 and is intended to dissipate heat generated thereby. System 1100 also includes memory 1130 and a motherboard 1140. Signal lines of motherboard 1140 may route I/O signals between IC die 1120 and memory 1130. System 1100 may comprise components of a desktop computing platform, and memory 1130 may comprise any type of memory for storing data, such as a Single Data Rate Random Access Memory, a Double Data Rate Random Access Memory, or a Programmable Read Only Memory.

The several embodiments described herein are solely for the purpose of illustration. Some embodiments may include any currently or hereafter-known versions of the elements described herein. Therefore, persons in the art will recognize from this description that other embodiments may be practiced with various modifications and alterations.

What is claimed is:

1. A method of manufacturing a heat sink, comprising:
    cladding an outer metal to a core metal to create a cladded heat sink fin;
    inserting the cladded heat sink fin in a groove of a heat sink base; and
    heating the outer metal to a reflow temperature of the outer metal.

2. The method of claim 1, further comprising:
    coupling the heat sink fin to the heat sink base with the outer metal.

3. The method of claim 2, further comprising:
    flowing the outer metal into the groove while heating the outer metal.

4. The method of claim 1, further comprising:
    applying a flux to the outer metal; and
    heating the flux to a melting temperature of the flux.

5. The method of claim 4, wherein heating the flux comprises:
heating the flux to the melting temperature of the flux to strip an impurity from the outer metal.

6. The method of claim 1, further comprising:
crimping a wall defining the groove toward the heat sink fin.

7. The method of claim 1, further comprising:
creating the heat sink base defining the groove.

8. A method, comprising:
cladding an upper metal to an upper surface of a heat sink-base, the clad upper metal defining one or more grooves;
inserting a heat sink fin into the groove; and
heating the clad upper metal to a reflow temperature of the clad upper metal.

9. The method of claim 8, further comprising:
coupling the heat sink fin to the clad upper metal.

10. The method of claim 8, wherein cladding the upper metal comprises:
pressing a roller having at least one ridge into the upper metal.

11. The method of claim 8, further comprising:
cladding a lower metal to a lower surface of the heat sink base.

12. The method of claim 11, further comprising:
coupling a pedestal to the clad lower metal; and
heating the clad lower metal to a reflow temperature of the clad lower metal to secure the pedestal to the clad lower metal.

* * * * *